United States Patent
Tokura et al.

(10) Patent No.: US 8,476,673 B2
(45) Date of Patent: Jul. 2, 2013

(54) DIODE

(75) Inventors: Norihito Tokura, Okazaki (JP); Satoshi Shiraki, Toyohashi (JP); Shigeki Takahashi, Okazaki (JP); Shinya Sakurai, Obu (JP); Takashi Suzuki, Toyota (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/296,832

(22) Filed: Nov. 15, 2011

(65) Prior Publication Data

US 2012/0139079 A1 Jun. 7, 2012

(30) Foreign Application Priority Data

Nov. 16, 2010 (JP) ................................. 2010-256107
Oct. 12, 2011 (JP) ................................. 2011-224879

(51) Int. Cl.
*H01L 29/861* (2006.01)
*H01L 29/747* (2006.01)
*H01L 31/107* (2006.01)

(52) U.S. Cl.
CPC .................................. *H01L 29/747* (2013.01)
USPC .... 257/110; 257/120; 257/122; 257/E29.335; 438/380

(58) Field of Classification Search
CPC .................................................. H01L 29/747
USPC ................. 257/104–106, 109–110, 129, 199, 257/475, 481, 483–484, 494, 496, 546, 594, 257/603, 605–606, E29.335, E29.327, E21.053, 257/611, E29.338, E29.339, E29.008, 120–122; 438/91–92, 141, 237, 328, 380
See application file for complete search history.

(56) References Cited

U.S. PATENT DOCUMENTS

| | | | | |
|---|---|---|---|---|
| 5,072,287 | A | * | 12/1991 | Nakagawa et al. ........... 257/500 |
| 5,146,297 | A | * | 9/1992 | Collins et al. ................. 257/469 |
| 5,294,825 | A | * | 3/1994 | Nakagawa et al. ........... 257/487 |
| 5,434,444 | A | * | 7/1995 | Nakagawa et al. ........... 257/487 |
| 5,883,414 | A | * | 3/1999 | Ito ................................. 257/355 |
| 5,969,400 | A | * | 10/1999 | Shinohe et al. ............... 257/492 |
| 5,982,015 | A | * | 11/1999 | Hirayama et al. ............ 257/483 |
| 6,207,484 | B1 | * | 3/2001 | Kim et al. ..................... 438/209 |
| 6,274,918 | B1 | * | 8/2001 | Tsai et al. ..................... 257/492 |
| 6,706,606 | B2 | * | 3/2004 | Romas et al. ................. 438/328 |
| RE41,368 | E | * | 6/2010 | Uemoto et al. ............... 257/347 |

(Continued)

FOREIGN PATENT DOCUMENTS

JP A-2006-270034 10/2006

*Primary Examiner* — Matthew Landau
*Assistant Examiner* — Maliheh Malek
(74) *Attorney, Agent, or Firm* — Posz Law Group, PLC

(57) ABSTRACT

A diode has a semiconductor layer and cathode and anode electrodes on a surface of the semiconductor layer. The semiconductor layer has cathode and anode regions respectively contacting the cathode and anode electrodes. The anode region has a first diffusion region having high surface concentration, a second diffusion region having intermediate surface concentration, and a third diffusion region having low surface concentration. The first diffusion region is covered with the second and third diffusion regions. The second diffusion region has a first side surface facing the cathode region, a second side surface opposite to the cathode region, and a bottom surface extending between the first and second side surfaces. The third diffusion region covers at least one of the first corner part connecting the first side surface with the bottom surface and the second corner part connecting the second side surface with the bottom surface.

9 Claims, 13 Drawing Sheets

U.S. PATENT DOCUMENTS

| | | | |
|---|---|---|---|
| 7,737,523 B2* | 6/2010 | Kikuchi et al. | 257/484 |
| 8,304,827 B2* | 11/2012 | Nakamura et al. | 257/328 |
| 2004/0251499 A1* | 12/2004 | Yamaguchi et al. | 257/343 |
| 2005/0017263 A1* | 1/2005 | Simmonet | 257/119 |
| 2006/0244081 A1* | 11/2006 | Zhu et al. | 257/409 |
| 2006/0255411 A1* | 11/2006 | Suzuki et al. | 257/360 |
| 2007/0126083 A1* | 6/2007 | Suzuki et al. | 257/595 |
| 2008/0164556 A1* | 7/2008 | Kikuchi et al. | 257/481 |
| 2009/0146241 A1* | 6/2009 | Yoshii | 257/476 |
| 2010/0187577 A1* | 7/2010 | Lin et al. | 257/280 |
| 2011/0079880 A1* | 4/2011 | Mita et al. | 257/546 |
| 2012/0119318 A1* | 5/2012 | Tokura et al. | 257/489 |

* cited by examiner

DIODE

CROSS REFERENCE TO RELATED APPLICATIONS

This application is based on Japanese Patent Application No. 2010-256107 filed on Nov. 16, 2010, and No. 2011-224879 filed on Oct. 12, 2011, the disclosures of which are incorporated herein by reference.

TECHNICAL FIELD

The present invention relates to a diode.

BACKGROUND

Development of a high-voltage IC obtained by integrating a plurality of kinds of semiconductor devices on an SOI (Silicon on Insulator) substrate using the insulating/isolating technique is being advanced. A diode is mounted on such a high-voltage IC. A diode formed in such an SOI substrate is often constructed as a lateral diode. Each of patent literatures 1 and 2 discloses an example of the lateral diode.

A lateral diode has an n-type cathode region, a p-type anode region, and an n-type drift region partitioning between the cathode region and the anode region. The anode region has a first diffusion region of high concentration and a second diffusion region covering the high-concentration first diffusion region and having impurity concentration lower than that of the first diffusion region. The anode region is often constructed by two kinds of diffusion regions. Generally, the impurity concentration and diffusion depth of the first diffusion region of high concentration are set to make electric connection to an anode electrode excellent and adjust an injection amount of holes at the time of forward bias. The impurity concentration and diffusion depth of the second diffusion region covering the first diffusion region are set to adjust the injection amount of holes at the time of forward bias together with the first diffusion region and reduce concentration of holes flowing toward the first diffusion region at the time of reverse recovery.

For example, when the impurity concentration of the second diffusion region covering the first diffusion region of high concentration is high, although on resistance at the time of forward bias decreases, the amount of holes injected to the drift region increases, a reverse recovery charge amount increases, and switching loss increases. On the other hand, when the impurity concentration of the second diffusion region is low, although the amount of holes injected to the drift region decreases and switching loss decreases, the on resistance at the time of forward bias increases. Consequently, the impurity concentration of the second diffusion region is preferably set to a certain level of concentration. When the diffusion of the second diffusion region is deep, although the on resistance at the time of forward bias decreases, the amount of holes injected to the drift region increases, a reverse recovery charge amount increases, and switching loss increases. On the other hand, when the diffusion of the second diffusion region is shallow, although the amount of holes injected to the drift region decreases and switching loss decreases, the on resistance at the time of forward bias increases. Consequently, the diffusion depth of the second diffusion region is also preferably set to some degree of depth.

[Patent literature 1]: Japanese Unexamined Patent Application Publication No. H11-233795 (corresponding to U.S. Pat. No. 5,982,015)

[Patent literature 2]: Japanese Unexamined Patent Application Publication No. 2006-270034

As described above, in the anode region constructed by the two kinds of diffusion regions, the second diffusion region defining the contour of the anode region is constructed with the certain level of impurity concentration and the some degree of diffusion depth. Consequently, a corner part having a certain curvature is formed in the anode region. A high electric field is applied to the corner part in the anode region at the time of reverse recovery and holes in reverse recovery current flow. Due to this, at the time of reverse recovery, a dynamic avalanche phenomenon occurs around the corner part, and the carrier amount at the time of reverse recovery increases. As a result, the reverse recovery charge amount increases, and the switching loss increases.

SUMMARY

In view of the above-described problem, it is an object of the present disclosure to provide a lateral diode having an excellent reverse recovery characteristic.

According to an aspect of the disclosure, a diode includes: a semiconductor layer; a cathode electrode arranged on a surface of the semiconductor layer; and an anode electrode arranged on the surface of the semiconductor layer and apart from the cathode electrode. The semiconductor layer has a cathode region having a first conduction type and an anode region having a second conduction type. The cathode region is arranged in a surface part of the semiconductor layer and is in contact with the cathode electrode. The anode region is arranged in another surface part of the semiconductor layer and is in contact with the anode electrode. The anode region has a first diffusion region having first surface concentration, a second diffusion region having second surface concentration, and a third diffusion region having third surface concentration. The first diffusion region extends to first depth from the surface of the semiconductor layer. The second diffusion region extends to second depth deeper than the first depth from the surface of the semiconductor layer. The second surface concentration is lower than the first surface concentration. The third diffusion region extends to third depth deeper than the second depth from the surface of the semiconductor layer. The third surface concentration is lower than the second surface concentration. The first diffusion region is covered with the second diffusion region and the third diffusion region. The second diffusion region has a first side surface facing the cathode region, a second side surface opposite to the cathode region, and a bottom surface extending between the first and second side surfaces. The second diffusion region further has a first corner part connecting the first side surface with the bottom surface and a second corner part connecting the second side surface with the bottom surface. The third diffusion region covers at least one of the first and second corner parts.

In the diode, since the impurity concentration of the third diffusion region is low, even if the third diffusion region is provided, increase in the injection amount of carriers at the time of forward bias is suppressed. On the other hand, since the corner part of the anode region is constructed by the third diffusion region having low impurity concentration, the electric field intensity in the corner part at the time of reverse recovery is lessened, and the dynamic avalanche phenomenon at the time of reverse recovery can be suppressed.

Accordingly, increase in the amount of carriers caused by the dynamic avalanche phenomenon at the time of reverse recovery is suppressed, so that the reverse recovery charge amount at the time of reverse recovery is suppressed to be small, and the switching loss decreases.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION

Characteristics of the technique disclosed in the specification will be summarized.

A diode is formed on a laminated substrate in which a semiconductor underlayer, a buried insulating layer, and a semiconductor upper layer are stacked. The laminated substrate is an SOI substrate.

The diode is formed in an island region surrounded by an insulating and isolating trench making a circle in the semiconductor upper layer.

The anode region in the diode makes a circle around the periphery of the island region along the insulating and isolating trench. The anode region in the diode is in contact with a side surface of the insulating and isolating trench.

In the anode region in the diode, the high-concentration anode diffusion region is in contact with the low-concentration anode diffusion region.

In the anode region in the diode, a low-concentration anode diffusion region covering a first corner part on the side of the cathode region and a low-concentration anode diffusion region covering a second corner part on the side opposite to the cathode region are formed. In this case, the diffusion depth of the low-concentration anode diffusion region covering the first corner part is greater than that of the low-concentration anode diffusion region covering the second corner part.

First Embodiment

Figure 1:
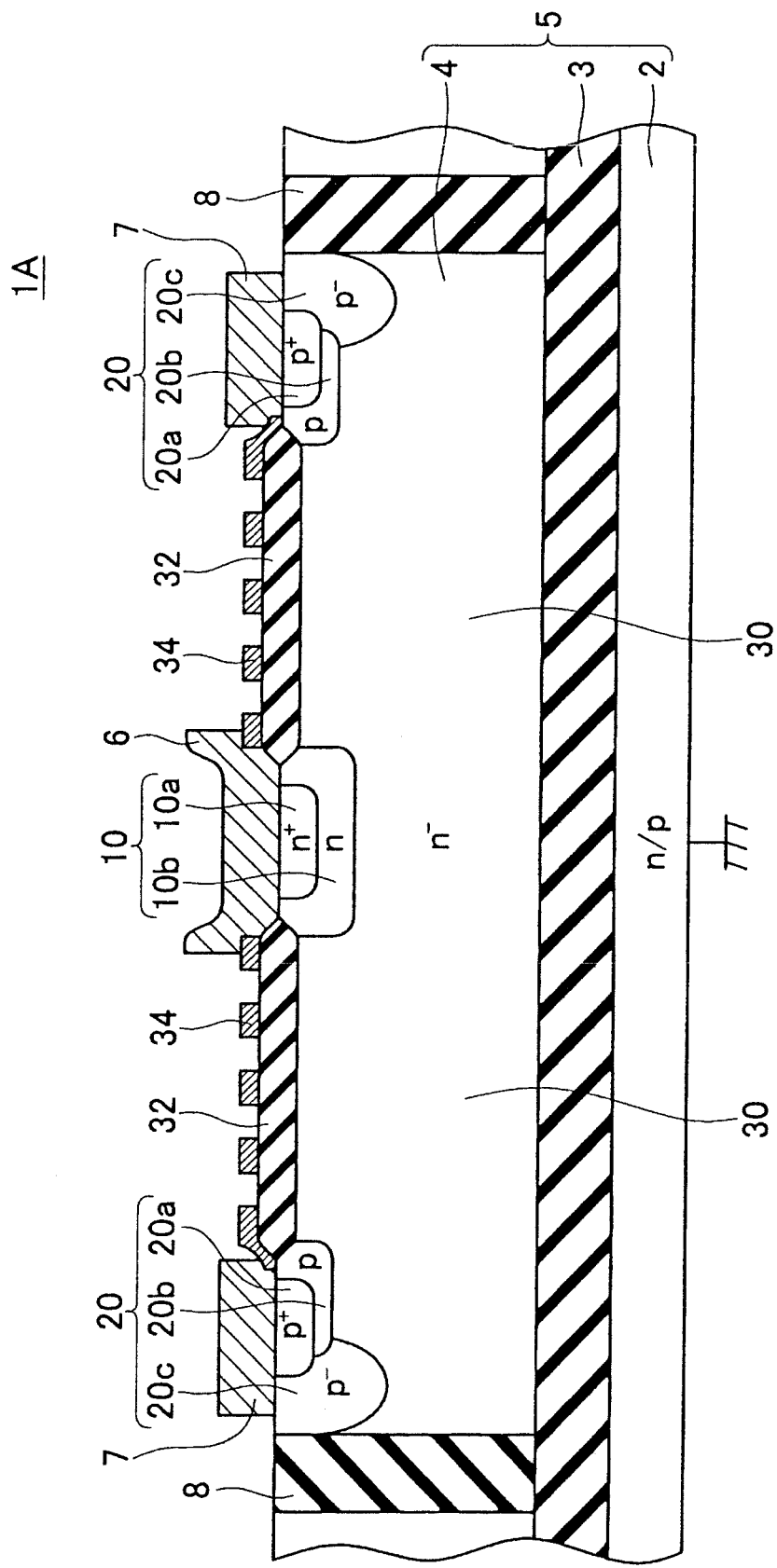
FIG. 1 is a cross section of a main part taken along line I-I of FIG. 2.
Figure 2:
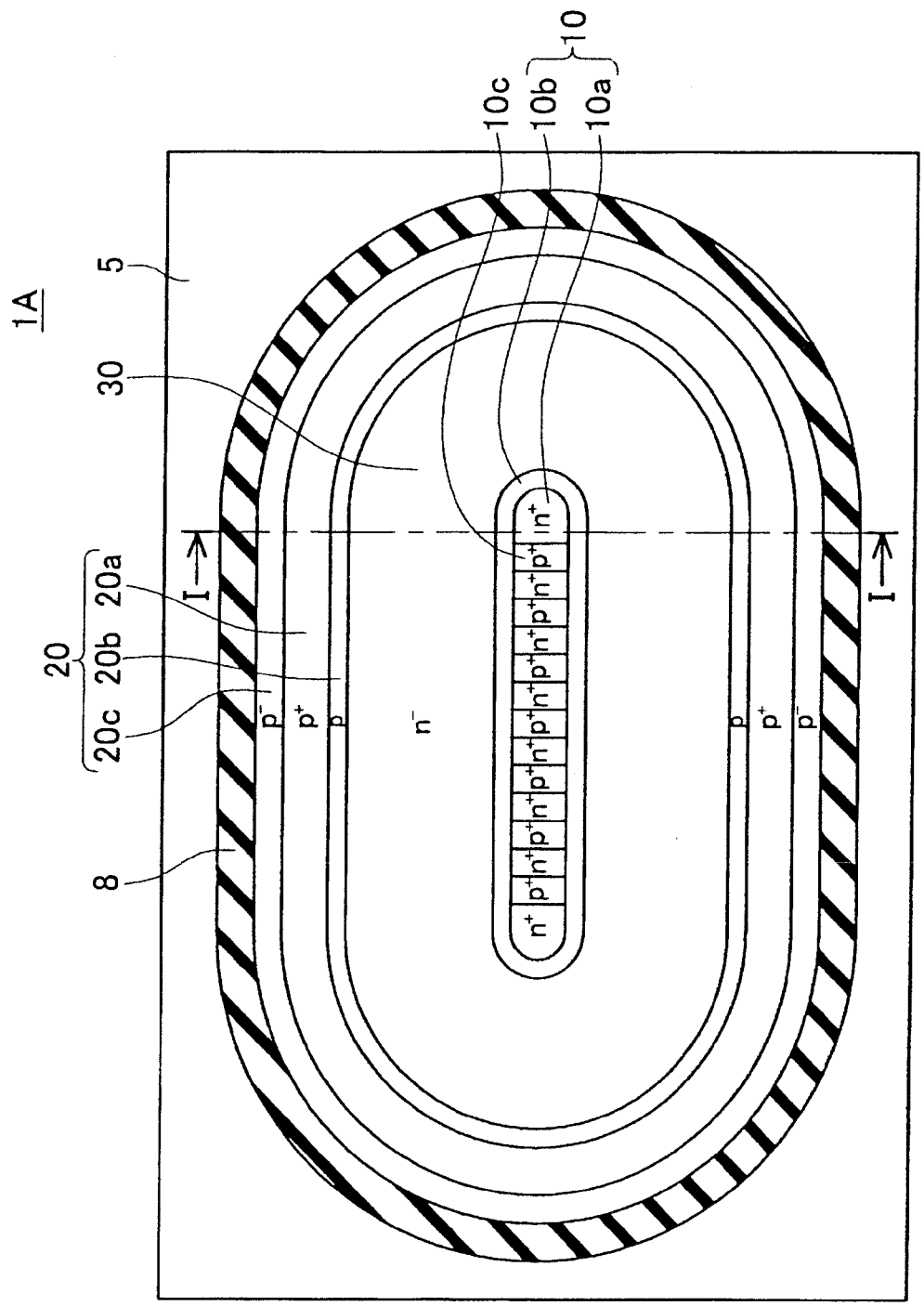
FIG. 2 is a plan view of a main part of an SOI substrate in which a diode is formed.

As illustrated in FIG. 1, a lateral diode 1A is formed in an SOI (Silicon On Insulator) substrate 5 in which an n-type or p-type semiconductor underlayer 2, a buried insulating layer 3, and an n⁻-type semiconductor upper layer 4 are stacked. As illustrated in FIG. 2, the diode 1A is formed in an island region of the semiconductor upper layer 4 surrounded by an insulating and isolating trench 8. In FIG. 2, electrodes and the like on the SOI substrate are not shown. The insulating and isolating trench 8 penetrates the semiconductor upper layer 4 from the surface of the semiconductor upper layer 4 and reaches the buried insulating layer 3, and makes a circle in the semiconductor upper layer 4 in plan view. In an example, single-crystal silicon is used as the material of the semiconductor underlayer 2 and the semiconductor upper layer 4, and silicon oxide is used as the material of the buried insulating layer 3. To realize withstand voltage of 500V or higher, the thickness of the buried insulating layer 3 is set to about 3 μm or larger. To realize withstand voltage of 500V or higher, the impurity concentration of the semiconductor upper layer 4 is about $7\times10^{14}$ cm$^{-3}$ and the thickness is about 10 to 20 μm.

As illustrated in FIG. 1, the diode 1A has a cathode electrode 6, an anode electrode 7, a LOCOS oxide film 32, and resistive field plates 34 provided on the surface of the semiconductor upper layer 4. The cathode electrode 6 and the anode electrode 7 are disposed with a distance therebetween in the surface of the semiconductor upper layer 4 and are electrically insulated from each other. As the cathode electrode 6 and the anode electrode 7, a laminated electrode made of titanium (Ti)/titanium nitride (TiN)/aluminum (Al) is used. Titanium is in contact with the semiconductor upper layer 4. In the titanium part, as necessary, silicide obtained by mixing silicon in titanium may be used. The LOCOS oxide film 32 is provided between the cathode electrode 6 and the anode electrode 7. The resistive field plate 34 is provided on the surface of the LOCOS oxide film 32. One end of the resistive field plate 34 is electrically connected to the cathode electrode 6, and the other end is electrically connected to the anode electrode 7. The LOCOS oxide film 32 and the resistive field plates 34 uniformize the potential distribution between the cathode electrode 6 and the anode electrode 7 in the surface layer part of the semiconductor upper layer 4.

In the surface layer part of the semiconductor upper layer 4, an n-type cathode region 10 and a p-type anode region 20 are formed. The cathode region 10 is in contact with the cathode electrode 6. The anode region 20 is in contact with the anode electrode 7. Between the cathode region 10 and the anode region 20, a drift region 30 is formed. The drift region 30 is a residual part after forming the cathode region 10 and the anode region 20 in the semiconductor upper layer 4. In the drift region 30, as necessary, a semiconductor region for higher withstand voltage (for example, a RESURF region) may be formed.

Figure 3:
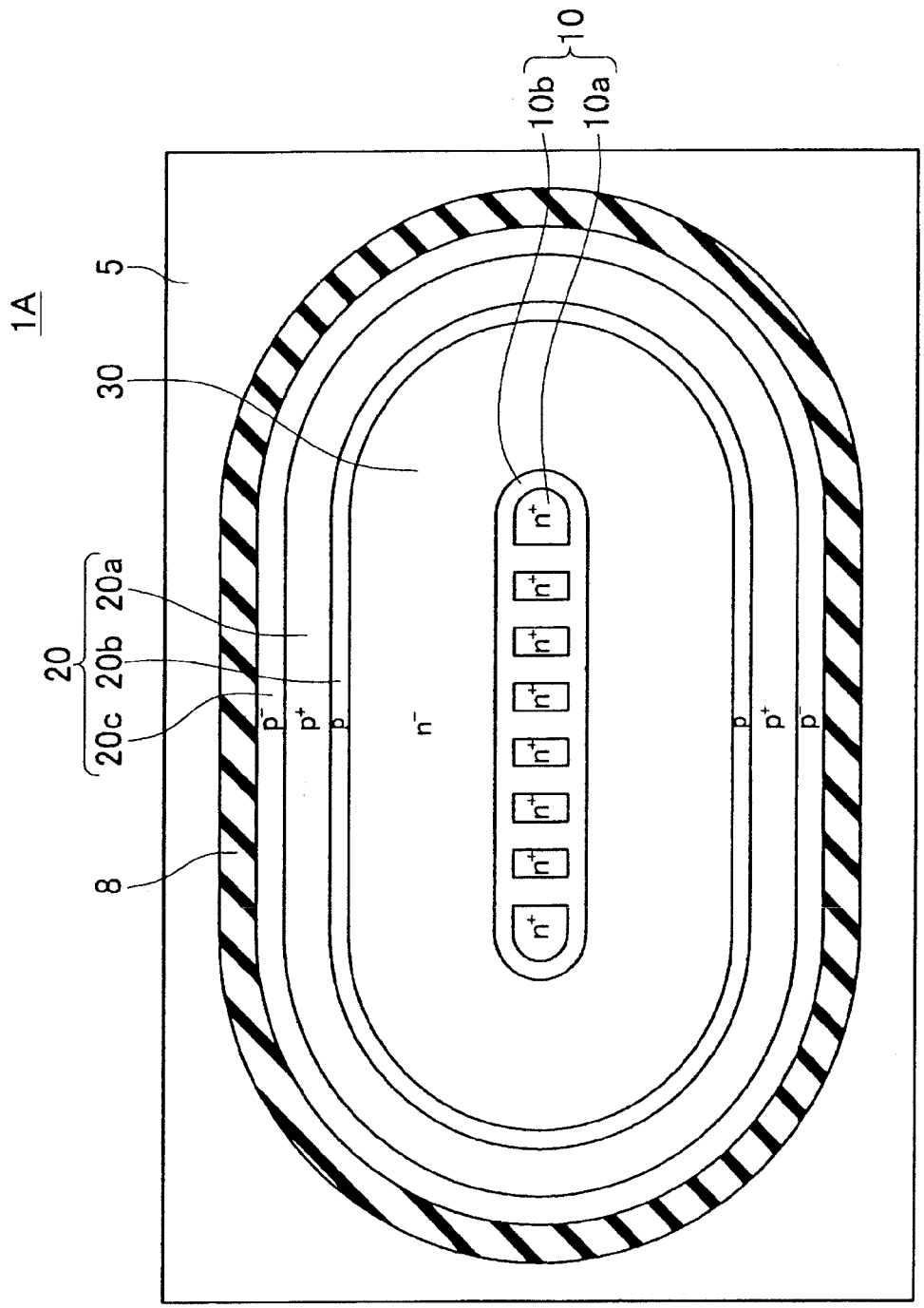
FIG. 3 shows a modification example of a diode in which the layout of a cathode region is different.
Figure 4:
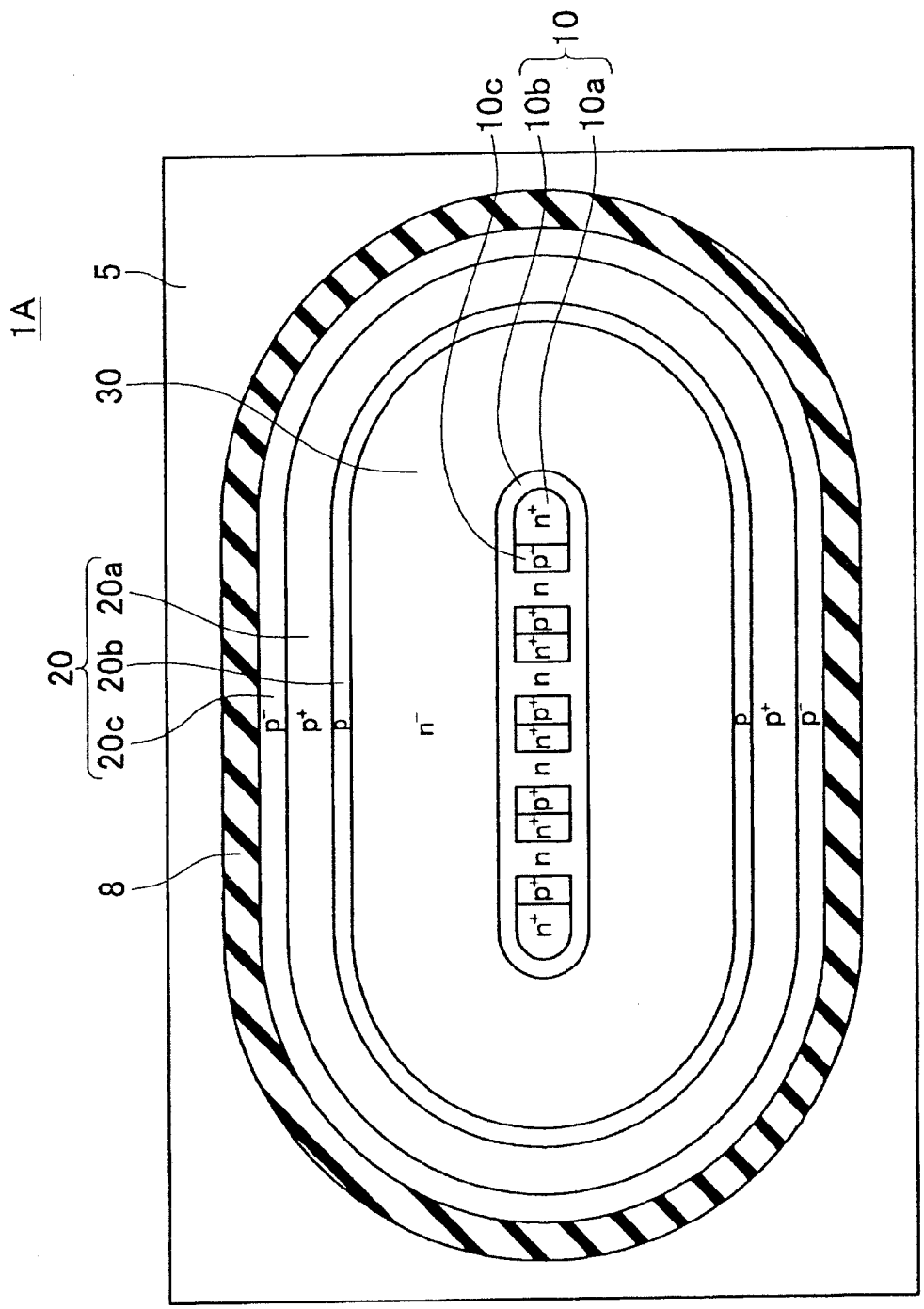
FIG. 4 shows another modification example of a diode in which the layout of the cathode region is different.

The cathode region 10 has an n⁺-type high-concentration cathode diffusion region 10a and an n-type low-concentration cathode diffusion region 10b. The diffusion depth of the low-concentration cathode diffusion region 10b is greater than that of the high-concentration cathode diffusion region 10a. Consequently, the entire high-concentration cathode diffusion region 10a is covered with the low-concentration cathode diffusion region 10b. As necessary, the low-concentration cathode diffusion region 10b may not be provided. As shown in FIG. 2, the cathode region 10 is disposed in a center of the island region surrounded by the insulating and isolating trench 8 and has an almost rectangular shape. The high-concentration cathode diffusion region 10a is divided in a plurality of pieces, and a p$^+$-type contact adjustment region 10c is formed between the neighboring high-concentration cathode diffusion regions 10a. As described above, the high-concentration cathode diffusion region 10a and the contact adjustment region 10c are repeatedly formed along the longitudinal direction of the cathode region 10. The contact adjustment regions 10c are formed to reduce the contact area between the cathode region 10 and the cathode electrode 6 and adjust the amount of electrons injected at the time of forward bias. The high-concentration cathode diffusion region 10a and the contact adjustment region 10c are in ohmic-contact with the cathode electrode 6, and the low-concentration cathode diffusion region 10b is in ohmic-contact with the cathode electrode 6. In an example, the surface concentration of the high-concentration cathode diffusion region 10a is about $6\times10^{20}$ cm$^{-3}$ and the diffusion depth is about 0.1 to 0.5 μm. The surface concentration of the low-concentration cathode diffusion region 10b is about $1.8\times10^{17}$ cm$^{-3}$ and the diffusion depth is about 3 to 7 μm. The surface concentration of the contact adjustment region 10c is about $1\times10^{20}$ cm$^{-3}$ and the diffusion depth is about 0.3 to 0.6 μm. As illustrated in FIG. 3, the contact adjustment region 10c may not be provided as necessary. As illustrated in FIG. 4, the low-concentration cathode diffusion region 10b may be interposed between the repetitive structure of the high-concentration cathode diffusion region 10a and the contact adjustment region 10c. Those layouts are examples and various layouts can be employed as combinations of the high-concentration cathode diffusion region 10a, the low-concentration cathode diffusion region 10b, and the contact adjustment region 10c.

Figure 5:
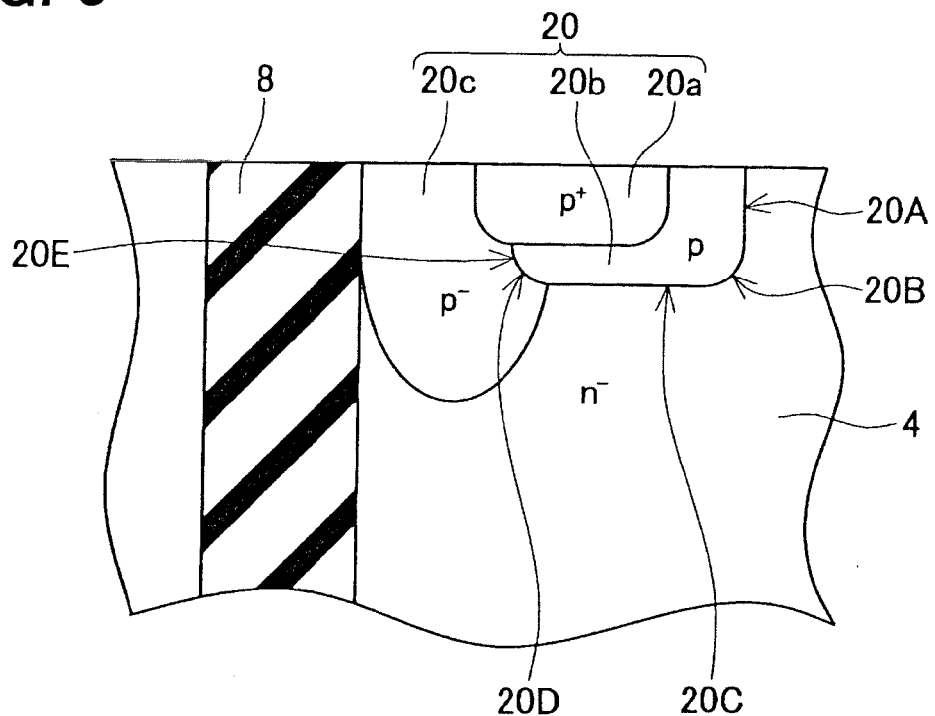
FIG. 5 is an enlarged cross section of a main part in an anode region.

FIG. 5 is an enlarged cross section of the anode region 20. The anode region 20 has a p$^+$-type high-concentration anode diffusion region 20a, a p-type intermediate-concentration anode diffusion region 20b, and a p$^-$-type low-concentration anode diffusion region 20c. The diffusion depth of the intermediate-concentration anode diffusion region 20b is greater than that of the high-concentration anode diffusion region 20a. The diffusion depth of the low-concentration anode diffusion region 20c is greater than that of the high-concentration anode diffusion region 20a and the intermediate-concentration anode diffusion region 20b. The high-concentration anode diffusion region 20a is in ohmic-contact with the anode electrode 7, and the intermediate-concentration anode diffusion region 20b and the low-concentration anode diffusion region 20c are in Schottky-contact with the anode electrode 7. As shown in FIG. 2, the high-concentration anode diffusion region 20a, the intermediate-concentration anode diffusion region 20b, and the low-concentration anode diffusion region 20c make a circle along the insulating and isolating trench 8 around the island region in plan view. As necessary, only linear parts of the high-concentration anode diffusion region 20a may be provided (that is, the corner parts of the high-concentration anode diffusion region 20a are not provided).

As illustrated in FIG. 5, the high-concentration anode diffusion region 20a is covered with the intermediate-concentration anode diffusion region 20b and the low-concentration anode diffusion region 20c. The intermediate-concentration anode diffusion region 20b has a first side surface 20A on the side of the cathode region 10, a second side surface 20E on the side opposite to the cathode region 10, and a bottom surface 20C extending between the first side surface 20A and the second side surface 20E. Between the first side surface 20A and the bottom surface 20C, a first corner part 20B exists. Between the second side surface 20E and the bottom surface 20C, a second corner part 20D exists.

The low-concentration anode diffusion region 20c covers the second corner part 20D of the intermediate-concentration anode diffusion region 20b. A part of the bottom surface 20C of the intermediate-concentration anode diffusion region 20b is not covered with the low-concentration anode diffusion region 20c. The low-concentration anode diffusion region 20c is in contact with the side surface of the insulating and isolating trench 8. The surface concentration of the high-concentration anode diffusion region 20a, that of the intermediate-concentration anode diffusion region 20b, and that of the low-concentration anode diffusion region 20c are desirably different almost every two digits. In an example, the surface concentration of the high-concentration anode diffusion region 20a is about $1\times10^{20}$ cm$^{-3}$ and the diffusion depth is about 0.2 to 0.6 μm. The surface concentration of the intermediate-concentration anode diffusion region 20b is about $9\times10^{17}$ cm$^{-3}$ and the diffusion depth is about 1 to 2 μm. The surface concentration of the low-concentration anode diffusion region 20c is about $1.2\times10^{16}$ cm$^{-3}$ and the diffusion depth is about 3 to 5 μm.

Figure 6:
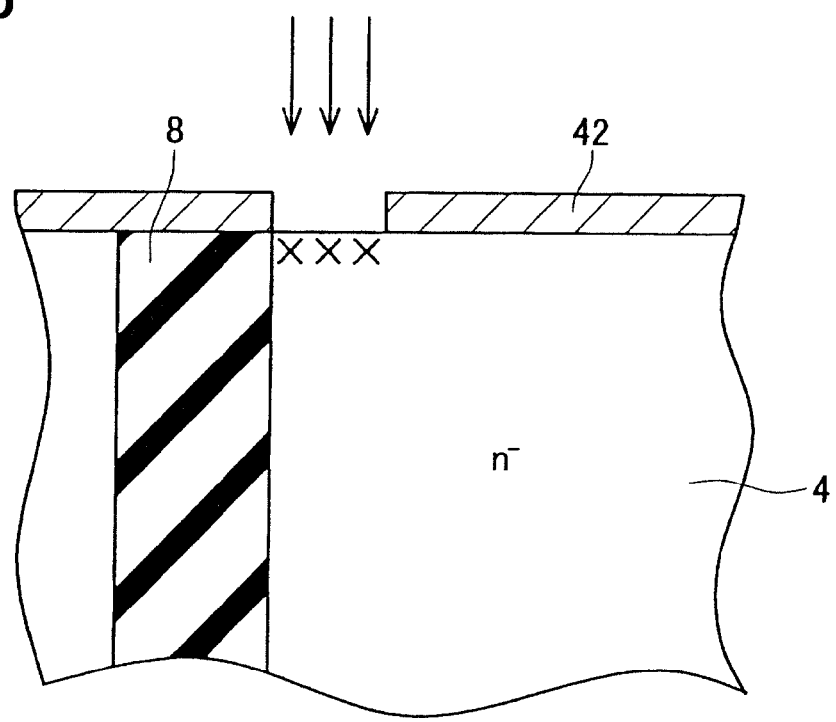
FIG. 6 is an enlarged cross section of a main part in a process of manufacturing the anode region.
Figure 7:
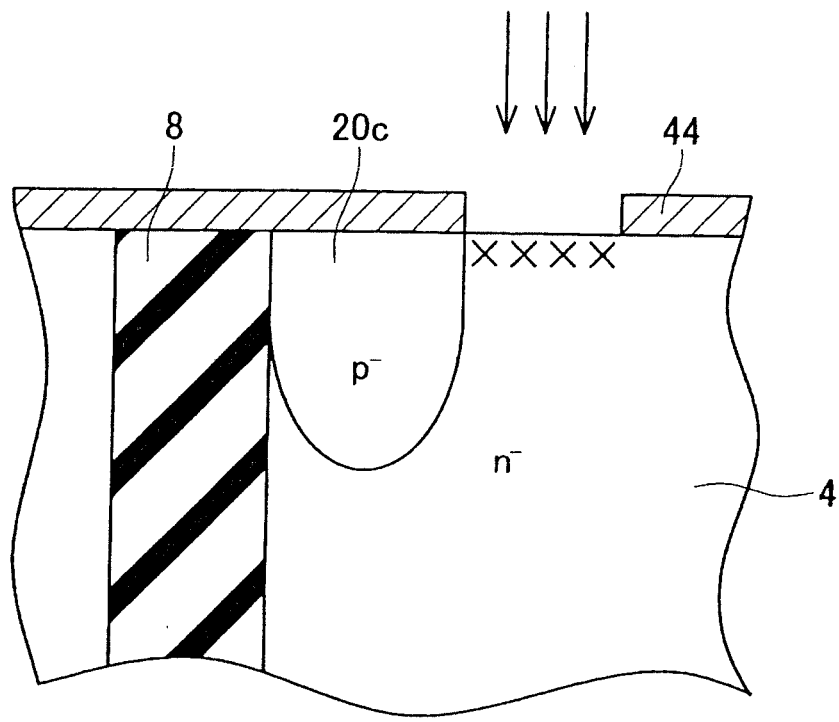
FIG. 7 is an enlarged cross section of a main part in the process of manufacturing the anode region.
Figure 8:
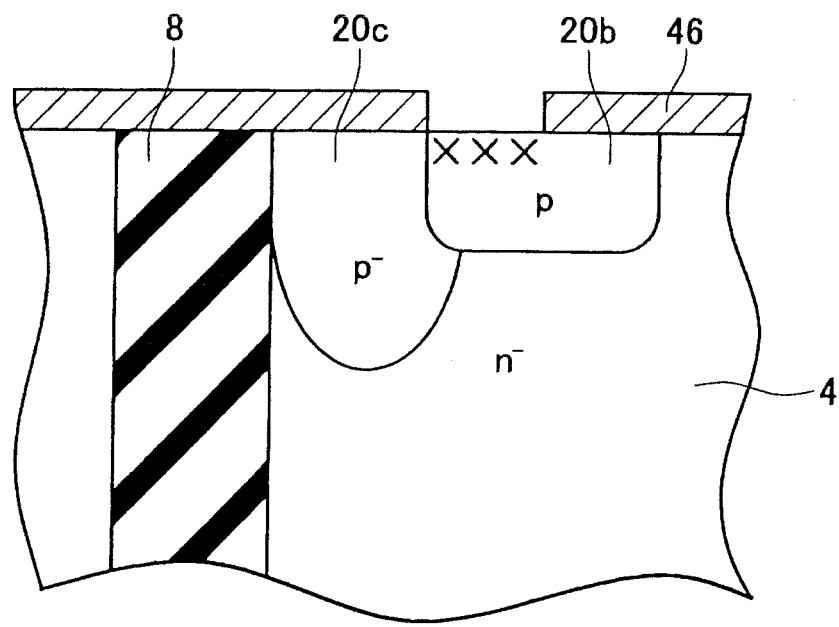
FIG. 8 is an enlarged cross section of a main part in the process of manufacturing the anode region.

In an example, using the manufacturing processes shown in FIGS. 6 to 8, the anode region 20 can be formed. First, as shown in FIG. 6, a resist 42 having an opening corresponding to the low-concentration anode diffusion region 20c is patterned on the surface of the semiconductor upper layer 4. Next, using the ion injection technique, boron is injected to the surface layer part of the semiconductor upper layer 4 via the opening. The process of forming the low-concentration anode diffusion region 20c can also be used as, for example, a process of forming a well region for a MOSFET formed in another region in the SOI substrate 5. Next, the resist 42 is removed and, after that, using the heat treatment technique, the injected boron is diffused and activated to form the low-concentration anode diffusion region 20c.

Next, as illustrated in FIG. 7, a resist 44 having an opening corresponding to the intermediate-concentration anode diffusion region 20b is patterned on the surface of the semiconductor upper layer 4. Next, using the ion injection technique, boron is injected to the surface layer part of the semiconductor upper layer 4 via the opening. The process of forming the intermediate-concentration anode diffusion region 20b can also be used as, for example, a process of forming a body region for a MOSFET or IGBT formed in another region in the SOI substrate 5. Next, the resist 44 is removed and, after that, using the heat treatment technique, the injected boron is diffused and activated to form the intermediate-concentration anode diffusion region 20b.

Next, as illustrated in FIG. 8, a resist 46 having an opening corresponding to the high-concentration anode diffusion region 20a is patterned on the surface of the semiconductor upper layer 4. Next, using the ion injection technique, boron is injected to the surface layer part of the semiconductor upper layer 4 via the opening. The process of forming the high-concentration anode diffusion region 20a can also be used as, for example, a process of forming a body contact region for a MOSFET or IGBT formed in another region in the SOI substrate 5. Next, the resist 46 is removed and, after that, using the heat treatment technique, the injected boron is diffused and activated to form the high-concentration anode diffusion region 20a.

The operation of the diode 1A will now be described. When potential higher than the cathode electrode 6 is applied to the anode electrode 7, the diode 1A is forward-biased. Accordingly, electrons are injected from the cathode region 10 to the drift region 30, and holes are injected from the anode region 20 to the drift region 30. As a result, in the diode 1A, current flows from the anode electrode 7 toward the cathode electrode 6.

Next, when potential higher than the anode electrode 7 is applied to the cathode electrode 6, the diode 1A is reverse-biased. Accordingly, the electrons injected to the drift region 30 at the time of the forward bias are ejected from the cathode region 10 and holes are ejected from the anode region 20. In such a manner, reverse recovery current flows to the diode 1A in the period of transition from the forward bias to the reverse bias. Since the reverse recovery charge amount of the reverse recovery current causes a switching loss, it is important to suppress the reverse recovery charge amount. To suppress the reverse recovery charge amount, it is important to decrease the amount of carriers injected at the time of forward bias and, further, suppress the generation amount of carriers caused by the dynamic avalanche phenomenon at the time of reverse recovery. The dynamic avalanche phenomenon denotes that, at the time of reverse recovery, holes flowing in the anode region 20 cause an avalanche phenomenon by high electric field applied to the pn junction between the anode region 20 and the drift region 30.

The anode region 20 in the diode 1A is characterized by being constructed by three diffusion regions 20a, 20b, and 20c of different concentrations. Since the impurity concentration of the low-concentration anode diffusion region 20c is extremely low, even when the low-concentration anode diffusion region 20c is provided, the amount of holes injected at the time of forward bias hardly increases. The amount of holes injected from the anode region 20 is determined by the high-concentration anode diffusion region 20a and the intermediate-concentration anode diffusion region 20b. That is, the amount of holes injected at the time of forward bias in the diode 1A is equivalent to that in the conventional structure.

Figure 9:
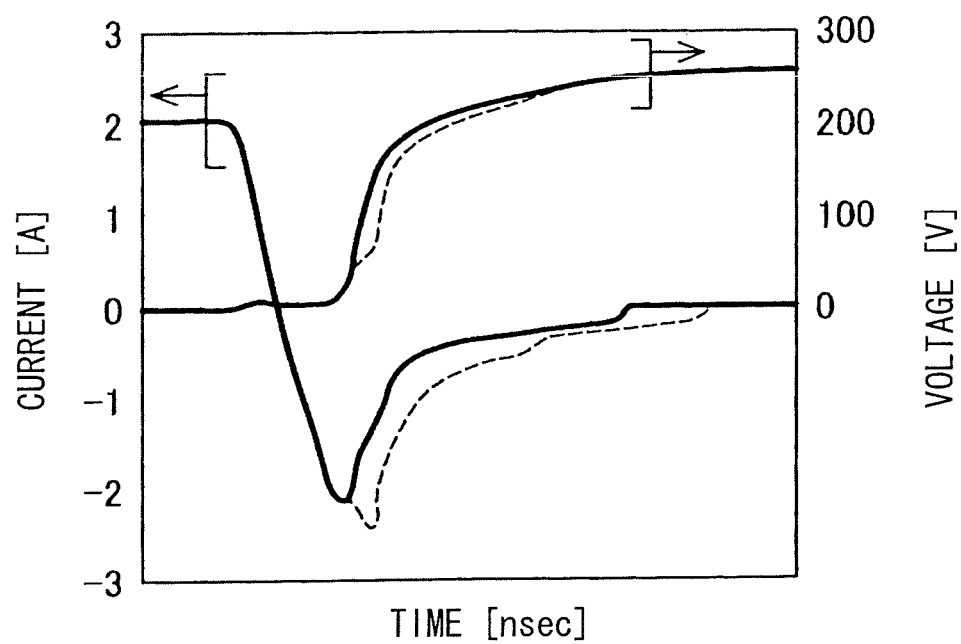
FIG. 9 shows the relation between reverse recovery current and voltage of a diode.

On the other hand, since the low-concentration anode diffusion region 20c is provided, the field intensity of the second corner part 20D at the time of the reverse recovery decreases conspicuously. Therefore, the dynamic avalanche phenomenon which occurs around the second corner part 20D is suppressed. FIG. 9 shows reverse recovery current in the diode 1A and the voltage applied across the cathode electrode 6 and the anode electrode 7 at that time. The solid lines indicate the case of the diode 1A of the embodiment, and broken lines indicate a result of a comparative example of the case where the low-concentration anode diffusion region 20c is not provided (the case where the anode region 20 is constructed only of the high-concentration anode diffusion region 20a and the intermediate-concentration anode diffusion region 20b). As shown in FIG. 9, in the comparative example, two peak waveforms appear in the reverse recovery current. Particularly, it is recognized that, at the peak in the latter half, the electric field is concentrated around the second corner part 20D, and the density of Hall current accompanying the dynamic avalanche phenomenon is recognized. On the other hand, in the embodiment, the two peak waveforms do not appear. In other words, in the embodiment, it can also be evaluated that the peak waveform in the latter half disappears. In the embodiment, it is confirmed that the electric field concentration around the second corner part 20D is lessened, and the density of Hall current accompanying the dynamic avalanche phenomenon decreases conspicuously. As a result, in the embodiment, it is understood that the reverse recovery charge amount decreases. As described above, the diode 1A of the embodiment has the reverse recovery characteristics that the reverse recovery charge amount is small and the switching loss is small.

The diode 1A has the following characteristics.

(1) As illustrated in FIG. 1, the low-concentration anode diffusion region 20c of the anode region 20 is in contact with the side face of the insulating and isolating trench 8. Due to this, a current path using the surface recombination effect in the interface between the low-concentration anode diffusion region 20c and the insulating and isolating trench 8 is formed. Consequently, at the time of reverse recovery, a part of reverse recovery current flows in the current path formed in the interface. As a result, the concentration of the reverse recovery current is lessened, so that occurrence of the dynamic avalanche phenomenon is suppressed.

(2) As the material of the cathode electrode 6 and the anode electrode 7 of the diode 1A of the embodiment, titanium is used. Consequently, in the anode region 20, the high-concentration anode diffusion region 20a and the anode electrode 7 are in ohmic contact with each other, and the intermediate-concentration anode diffusion region 20b and the anode electrode 7 are in Schottky contact with each other. Due to this, at the time of the forward bias, the amount of holes injected from the anode region 20 can be suppressed. By lowering the impurity concentration of the intermediate-concentration anode diffusion region 20b, current concentration at the time of the reverse recovery can be suppressed. Further, by forming the low-concentration anode diffusion region 20c so that diffusion is deep, occurrence of carriers caused by the dynamic avalanche phenomenon by application of reverse bias after the ejection of holes can be suppressed. To realize Schottky contact between the intermediate-concentration anode diffusion region 20b and the anode electrode 7, it is sufficient that the work function of the material used for the anode electrode 7 is 5.16 eV or less. Consequently, as the material of the anode electrode 7, nickel, copper, or the like may be used in place of titanium.

(3) As illustrated in FIG. 5, in the diode 1A, the high-concentration anode diffusion region 20a is provided so as to be biased to the side opposite to the cathode region 10 in the intermediate-concentration anode diffusion region 20b so that the high-concentration anode diffusion region 20a is in contact with the low-concentration anode diffusion region 20c. With the configuration, the current path at the time of forward bias extends in the anode region 20, so that a wide range of the drift region 30 can be used as the current path, and the on resistance can be decreased. Since the current path at the time of reverse bias also extends in the anode region 20, occurrence of the dynamic avalanche phenomenon can also be suppressed.

(4) As illustrated in FIG. 5, in the diode 1A, a part of the bottom surface 20C of the intermediate-concentration anode diffusion region 20b is not covered with the low-concentration anode diffusion region 20c. For example, even if the low-concentration anode diffusion region 20c is formed so as to completely cover the intermediate-concentration anode diffusion region 20b, it is advantageous from the viewpoint that the dynamic avalanche phenomenon in the corner parts 20B and 20D in the intermediate-concentration anode diffusion region 20b can be suppressed. However, if such a large low-concentration anode diffusion region 20c is provided, even if the impurity concentration is adjusted to be low, the injection amount of holes at the time of forward bias may increase. By selectively covering only the corner part of the intermediate-concentration anode diffusion region 20b with the low-concentration anode diffusion region 20c like in the diode 1 of the embodiment, occurrence of the dynamic avalanche phenomenon can be effectively suppressed without enlarging the formation range of the low-concentration anode diffusion region 20c.

Figure 10:
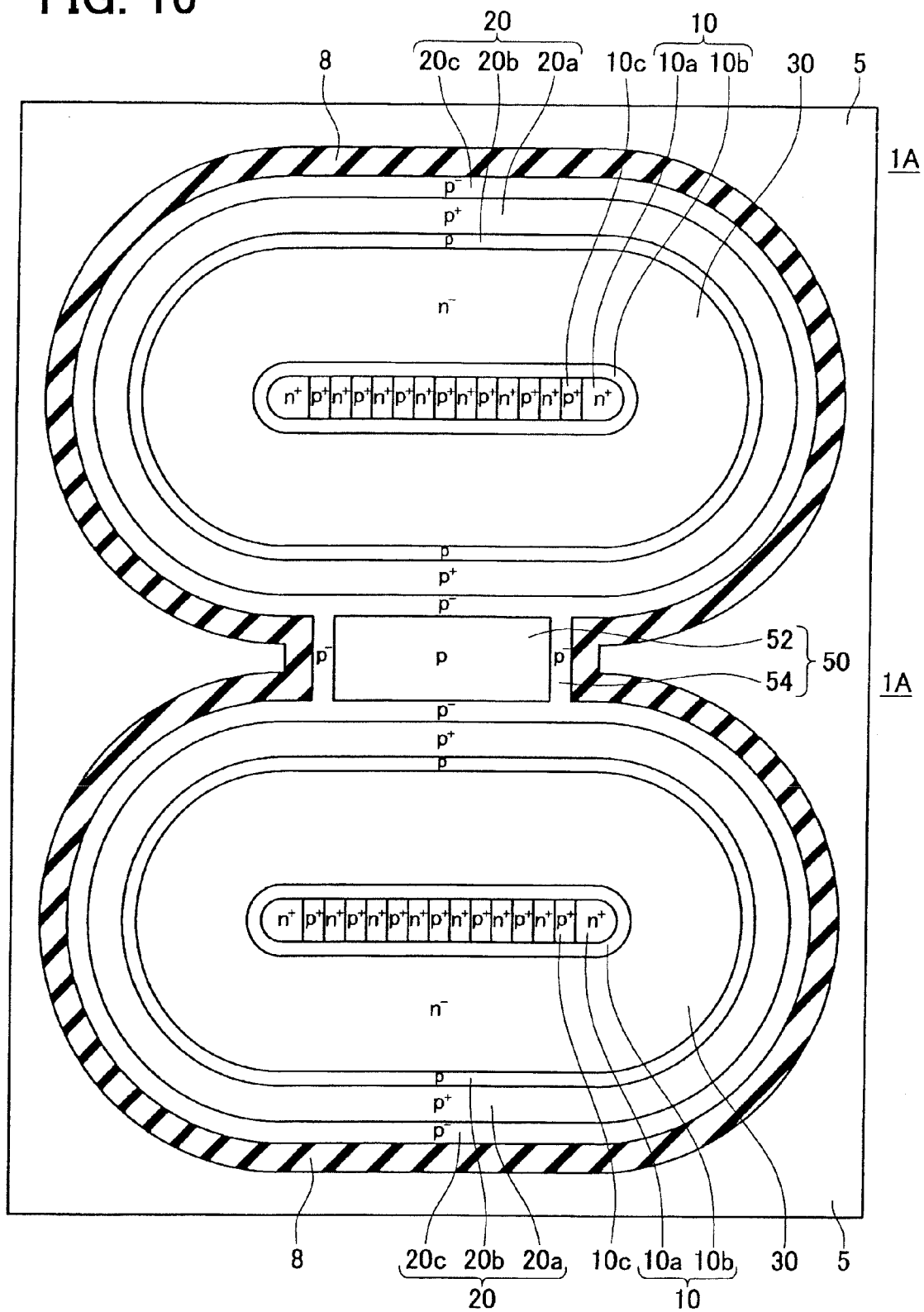
FIG. 10 shows an example of a configuration in which a plurality of diodes are disposed.
Figure 11:
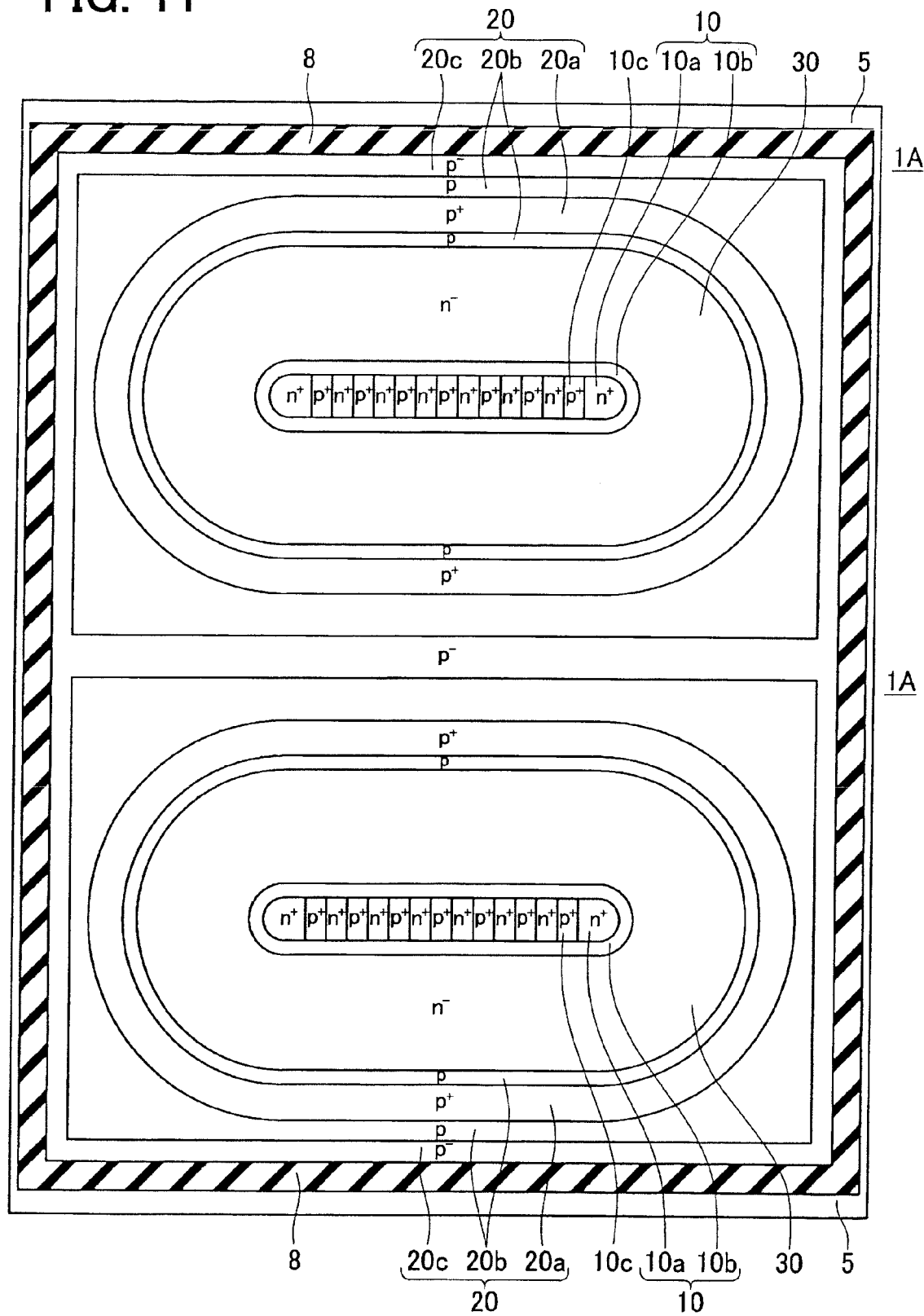
FIG. 11 shows another example of a configuration in which a plurality of diodes are disposed.

(5) Each of FIGS. 10 and 11 shows an example in which a plurality of diodes 1A are arranged on the SOI substrate 5. Although each of FIGS. 10 and 11 shows an example where two diodes 1A are mounted, the present invention is not limited to the example but more than two diodes 1A may be arranged on the SOI substrate 5. In the example of FIG. 10, the track-shaped insulating and isolating trenches 8 of the diodes 1A are coupled to form a single island region. In a coupling part 50, a p-type intermediate-concentration coupling diffusion region 52 and a p$^-$-type low-concentration coupling diffusion region 54 are formed. The intermediate-concentration coupling diffusion region 52 is formed by the process common to that of the intermediate-concentration anode diffusion region 20b and has the same concentration profile as that of the intermediate-concentration anode diffusion region 20b. The intermediate-concentration coupling diffusion region 52 may not be provided as necessary. The low-concentration coupling diffusion region 54 is formed by the process common to that of the low-concentration anode diffusion region 20c and has the same concentration profile as that of the low-concentration anode diffusion region 20c. The low-concentration coupling diffusion region 54 is formed in contact with the insulating and isolating trench 8 and covers the corner parts of the intermediate-concentration coupling diffusion region 52. In the example, also in the coupling part, the electric field concentration is lessened. In the example of FIG. 11, a single island region is formed by a rectangular insulating and isolating trench 8. In the example, the intermediate-concentration anode diffusion region 20b is formed widely in the outer range of the track-shaped diode. The low-concentration anode diffusion region 20c is formed in contact with the insulating and isolating trench 8 and covers the corner parts of the intermediate-concentration coupling diffusion region 52. Also in the example, the electric field concentration in the corner parts of the intermediate-concentration anode diffusion region 20b is lessened.

Figure 12:
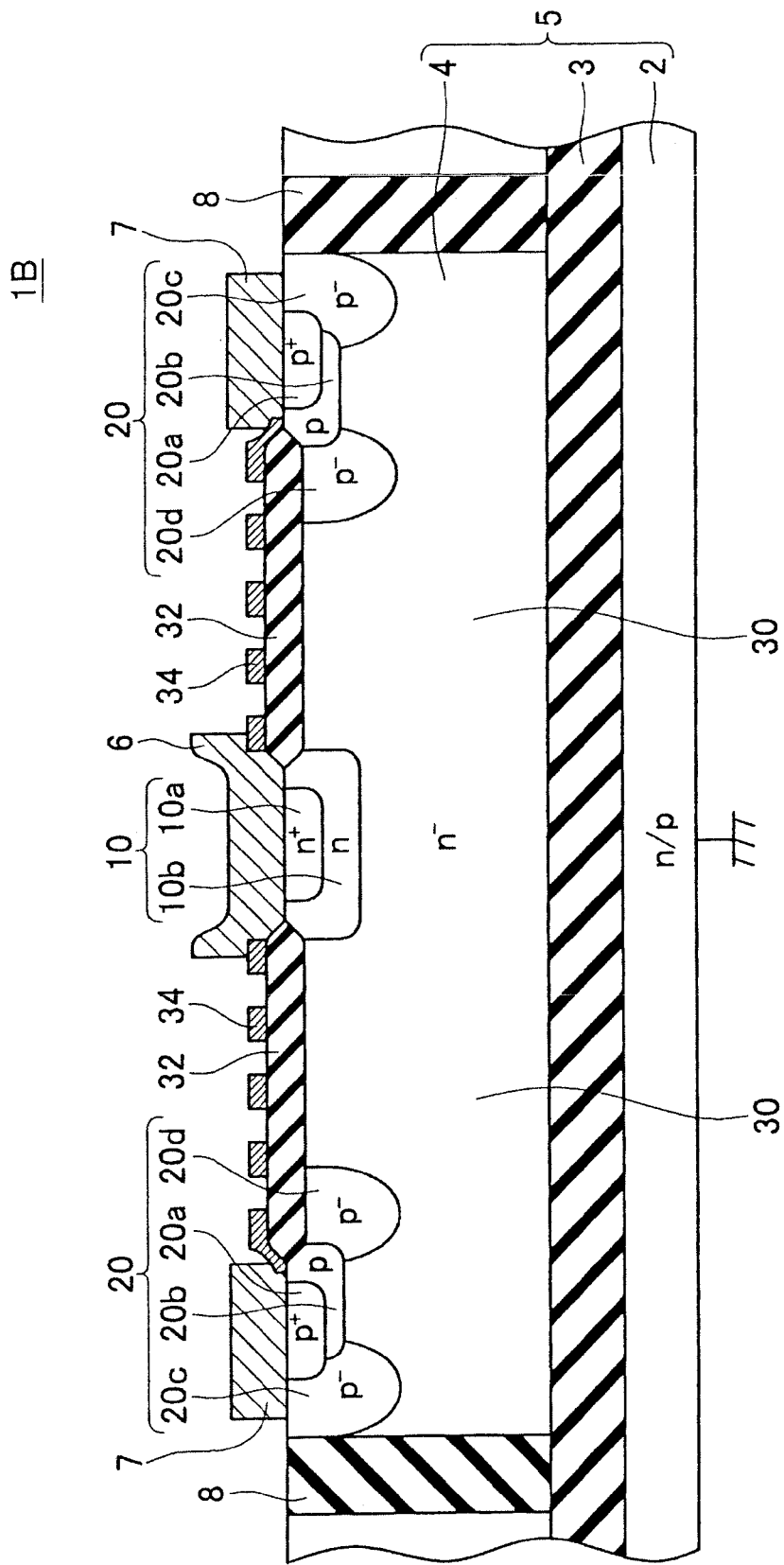
FIG. 12 is a plan view of a main part of a diode as a modification of a first example.

(6) FIG. 12 illustrates a diode 1B as a modification of the embodiment. In the diode 1B as the modification, a low-concentration anode diffusion region 20d is formed so as to cover the first corner part 20B of the intermediate-concentration anode diffusion region 20b. With the configuration, both of the first corner part 20B and the second corner part 20D of the intermediate-concentration anode diffusion region 20b are covered with the low-concentration anode diffusion regions 20c and 20d, so that the dynamic avalanche phenomenon in both of the first corner part 20B and the second corner part 20D is suppressed. Desirably, the diffusion depth of the low-concentration anode diffusion region 20d covering the first corner part 20B is greater than that of the low-concentration anode diffusion region 20c covering the second corner part 20D. The low-concentration anode diffusion region 20d covering the first corner part 20B may be in contact with the buried insulating layer 3. The deeper the diffusion of the low-concentration anode diffusion region 20d covering the first corner part 20B is, the more the reverse recovery charge amount is decreased.

Second Embodiment

Figure 13:
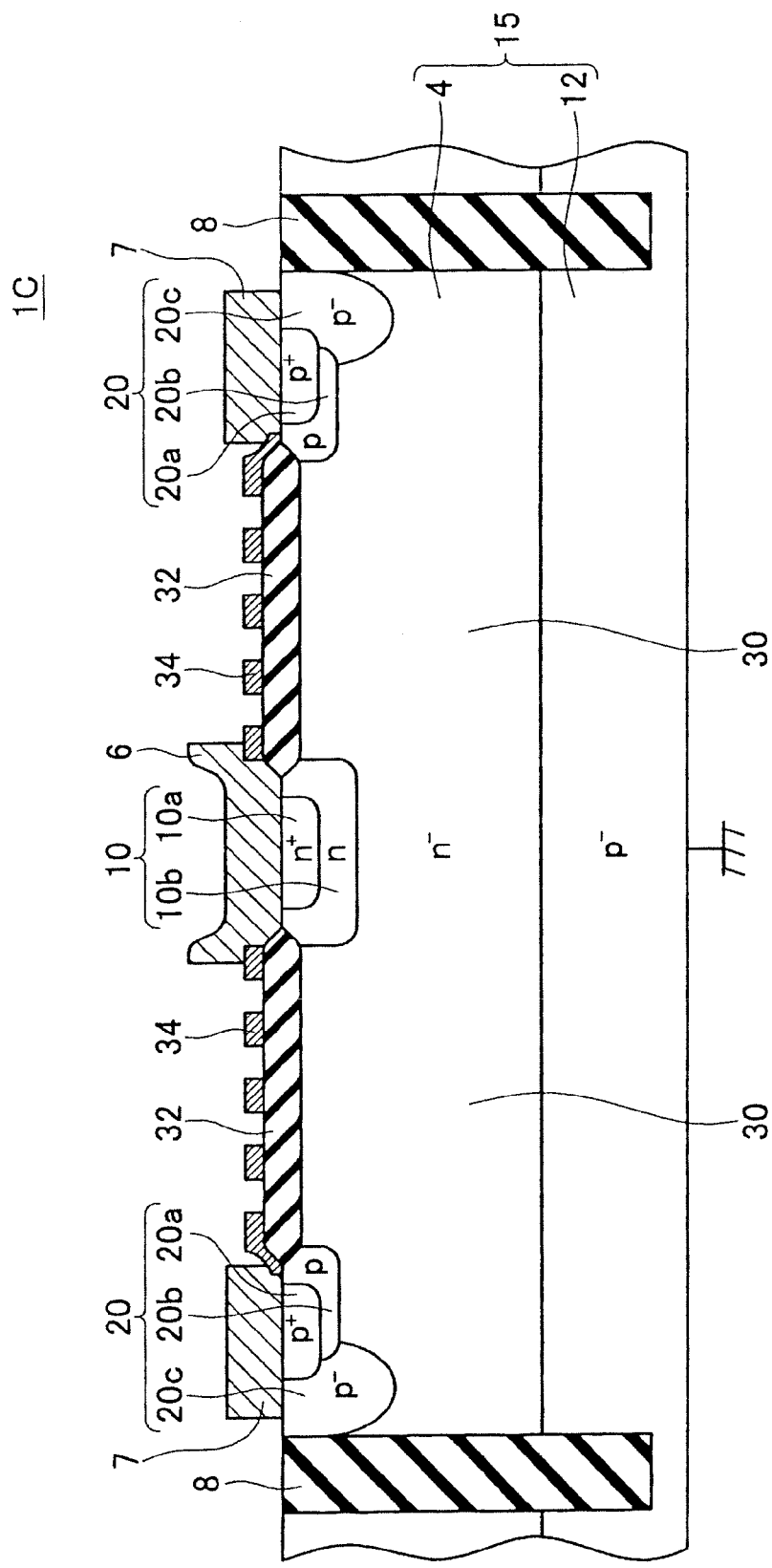
FIG. 13 is a plan view of a main part of a diode as a second example.
Figure 14:
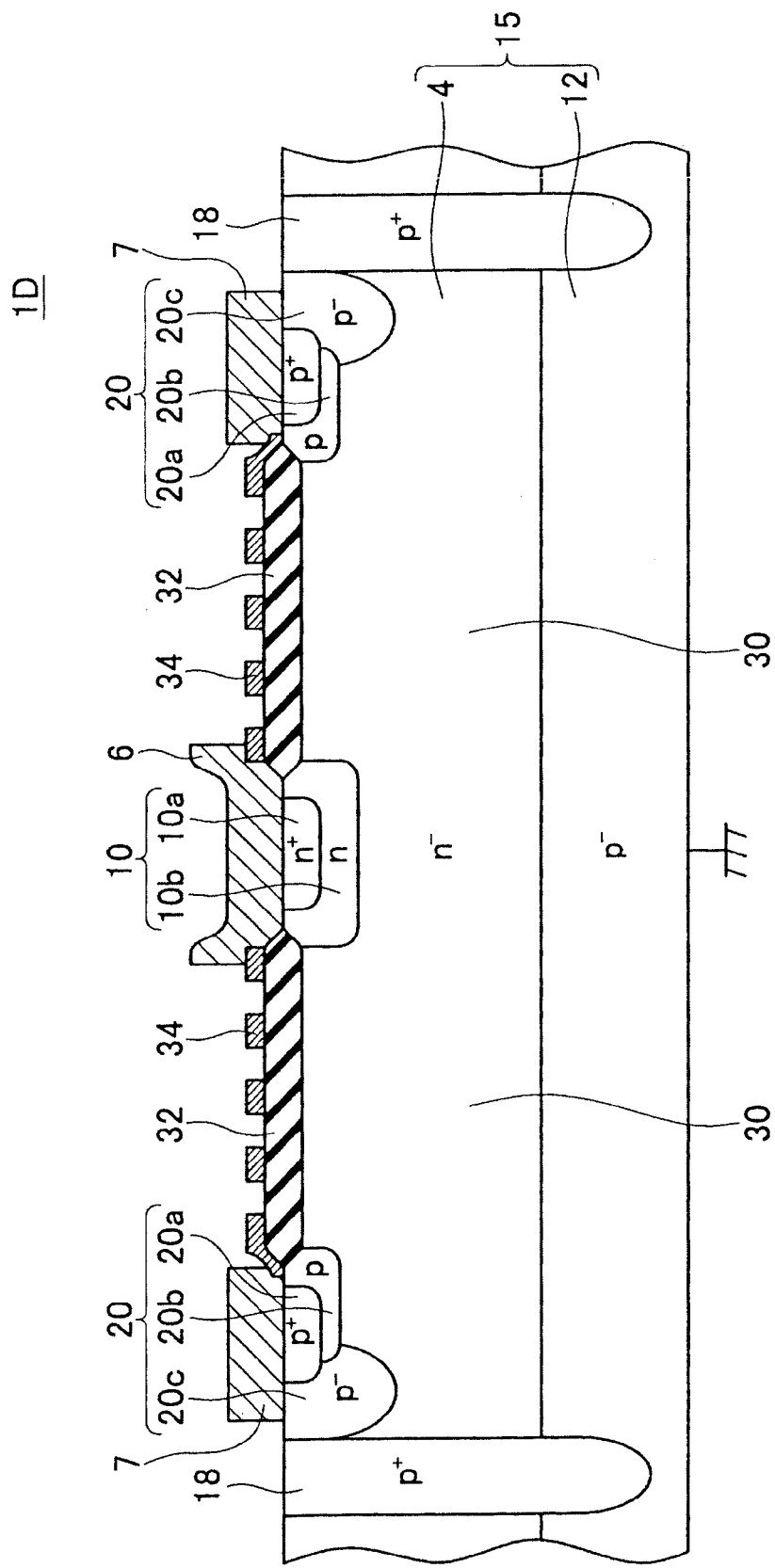
FIG. 14 is a cross section of a main part of a diode as a modification of the second example.

FIG. 13 shows a diode 1C formed by using an epitaxial substrate 15. The epitaxial substrate 15 is formed by epitaxially growing the semiconductor upper layer 4 on a p$^-$-type semiconductor underlayer 12. A pn junction is formed between the semiconductor underlayer 12 and the semiconductor upper layer 4. The semiconductor underlayer 12 is fixed to the ground voltage. Also in the example, the device is isolated by using the insulating and isolating trench 8. Like in a diode 1D shown in FIG. 14, the device may be isolated by using a p$^+$-type diffusion isolation region 18 in place of the insulating and isolating trench 8. The technique disclosed in the specification can also be used for the diodes 1C and 1D formed by using the epitaxial substrate 15.

Third Embodiment

Figure 15:
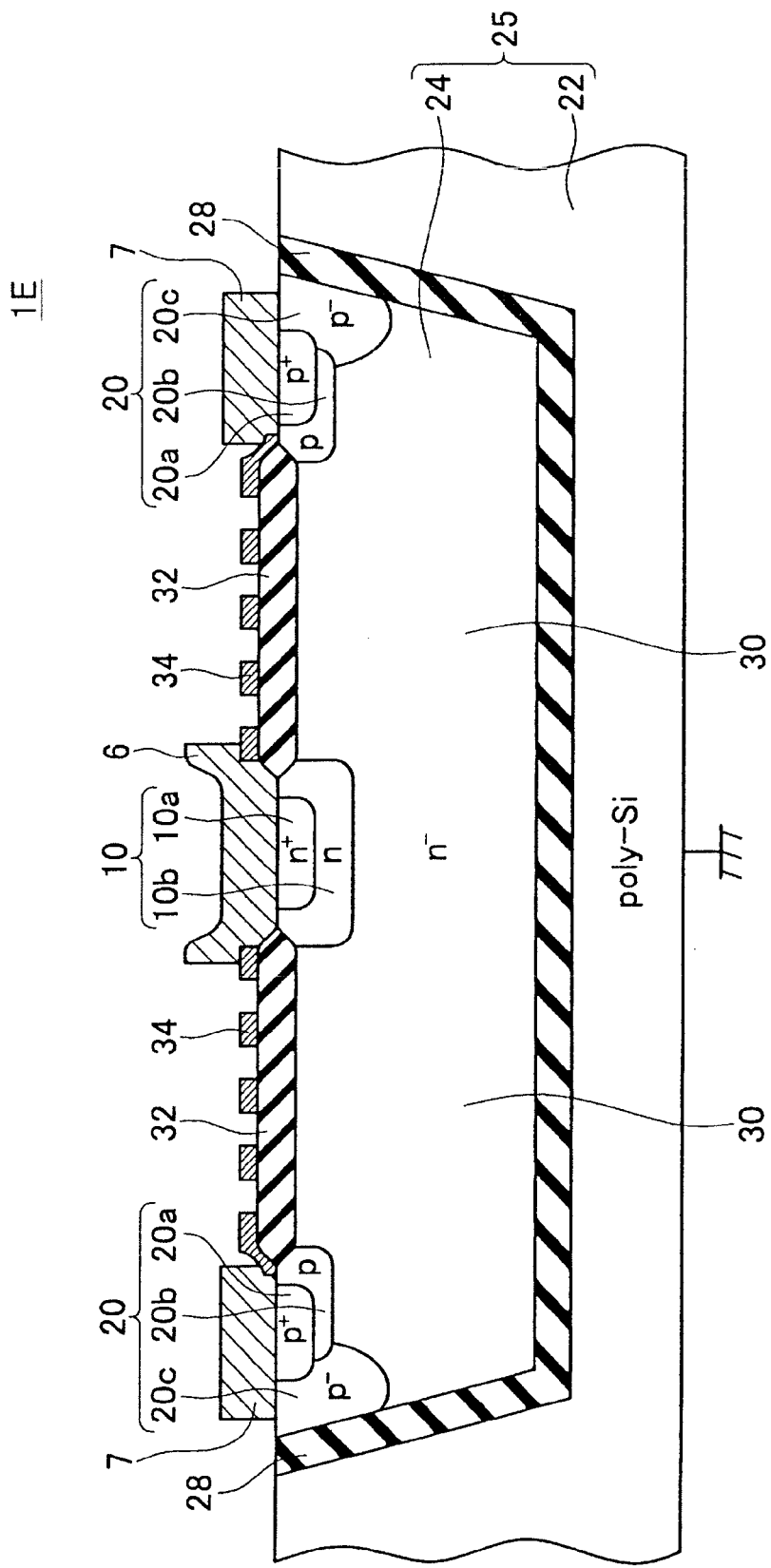
FIG. 15 is a cross section of a main part of a diode as a third example.

FIG. 15 shows a diode 1E formed by using a polysilicon substrate 25. The polysilicon substrate 25 is formed by forming a trench in the surface part of a polysilicon layer 22, anodizing the inner surface of the trench to form a dielectric film 28 of silicon oxide and, subsequently, filling the trench with a single-crystal silicon layer 24. The polysilicon layer 22 is fixed to the ground voltage. In this example, the device is isolated by using the dielectric film 28. The technique disclosed in the specification is useful also to the diode 1E formed by using the polysilicon substrate 25.

For example, although silicon is used as the semiconductor material in the embodiment, a wide-gap semiconductor may be used in place of silicon.

The technical elements described in the specification or drawings display technical utility singularly or in various combinations and are not limited to the combinations described in the claims in the application. The technique in the specification or drawings can achieve a plurality of purposes at the same time and has the technical utility by achieving one of the purposes.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A diode comprising:
   a semiconductor layer;
   a cathode electrode arranged on a surface of the semiconductor layer; and
   an anode electrode arranged on the surface of the semiconductor layer and apart from the cathode electrode,
   wherein
   the semiconductor layer has a cathode region having a first conduction type and an anode region having a second conduction type,
   the cathode region is arranged in a surface part of the semiconductor layer and is in contact with the cathode electrode,
   the anode region is arranged in another surface part of the semiconductor layer and is in contact with the anode electrode,
   the anode region has a first diffusion region having first surface concentration, a second diffusion region having second surface concentration, and a third diffusion region having third surface concentration,
   the first diffusion region extends to first depth from the surface of the semiconductor layer,
   the second diffusion region extends to second depth deeper than the first depth from the surface of the semiconductor layer,
   the second surface concentration is lower than the first surface concentration, the third diffusion region extends to third depth deeper than the second depth from the surface of the semiconductor layer, the third surface concentration is lower than the second surface concentration, the first diffusion region is covered with the second diffusion region and the third diffusion region, the second diffusion region has a first side surface facing the cathode region, a second side surface opposite to the cathode region, and a bottom surface extending between the first and second side surfaces, the second diffusion region further has a first corner part connecting the first side surface with the bottom surface and a second corner part connecting the second side surface with the bottom surface, the third diffusion region covers at least one of the first and second corner parts, and a part of the bottom surface of the second diffusion region is not covered with the third diffusion region.

2. The diode according to claim 1,
wherein the third diffusion region covers both of the first and second corner parts of the second diffusion region.

3. The diode according to claim 1,
wherein the anode electrode is in ohmic contact with the first diffusion region and is in Schottky contact with the second diffusion region.

4. The diode according to claim 1,
wherein the bottom surface of the second diffusion region is flat and is parallel to the surface of the semiconductor layer, and
wherein the first and second side surfaces of the second diffusion region are perpendicular to the surface of the semiconductor layer.

5. The diode according to claim 1,
wherein the semiconductor layer is an SOI layer of an SOI substrate,
wherein the semiconductor layer further has an insulating and isolating trench, which surrounds the SOI layer, and
wherein the diode is disposed in an island region surrounded by the insulating and isolating trench.

6. The diode according to claim 5,
wherein the anode region is in contact with the insulating and isolating trench and surrounds the island region, and
wherein the anode region surrounds a periphery of the cathode region.

7. The diode according to claim 6,
wherein the first diffusion region is in contact with the third diffusion region.

8. The diode according to claim 7, further comprising:
a LOCOS oxide film arranged on the surface of the semiconductor layer; and
a plurality of resistive field plates,
wherein the LOCOS oxide film covers the surface of the semiconductor layer other than the cathode electrode and the anode electrode, and
wherein the plurality of resistive field plates are disposed on the LOCOS oxide film.

9. The diode according to claim 8,
wherein the semiconductor layer has the first conduction type,
wherein the cathode region has a high-concentration cathode region and a low-concentration cathode region,
wherein the low-concentration cathode region is disposed deeper than the high-concentration cathode region, and
wherein the low-concentration cathode region surrounds the high-concentration cathode region.

* * * * *